(12) United States Patent
Oglesbee et al.

(10) Patent No.: US 6,600,641 B2
(45) Date of Patent: Jul. 29, 2003

(54) OVERCURRENT PROTECTION FOR THE SERIES FUSE

(75) Inventors: John Wendell Oglesbee, Watkinsville, GA (US); Philip Henry Burrus, IV, Lilburn, GA (US)

(73) Assignee: Motorola, Inc., Schaumburg, IL (US)

( * ) Notice: Subject to any disclaimer, the term of this patent is extended or adjusted under 35 U.S.C. 154(b) by 163 days.

(21) Appl. No.: 09/738,092

(22) Filed: Dec. 15, 2000

(65) Prior Publication Data

US 2002/0027758 A1 Mar. 7, 2002

Related U.S. Application Data

(63) Continuation-in-part of application No. 09/545,135, filed on Apr. 7, 2000, now Pat. No. 6,300,750.
(60) Provisional application No. 60/203,795, filed on May 9, 2000, provisional application No. 60/202,150, filed on May 5, 2000, provisional application No. 60/172,273, filed on Dec. 17, 1999, provisional application No. 60/172,272, filed on Dec. 17, 1999, and provisional application No. 60/161,191, filed on Oct. 22, 1999.

(51) Int. Cl.$^7$ .................................................. H02H 5/00
(52) U.S. Cl. ........................ 361/103; 361/24; 361/93.1; 361/115
(58) Field of Search .......................... 361/103, 23, 24, 361/30, 104, 93.1, 115

(56) References Cited

U.S. PATENT DOCUMENTS

| | | | | |
|---|---|---|---|---|
| 5,581,170 A | * | 12/1996 | Mammano et al. | 320/116 |
| 5,600,575 A | * | 2/1997 | Anticole | 330/146 |
| 5,644,510 A | * | 7/1997 | Weir | 361/23 |
| 5,943,203 A | * | 8/1999 | Wang | 361/103 |

* cited by examiner

*Primary Examiner*—Stephen W. Jackson
*Assistant Examiner*—James A. Demakis
(74) *Attorney, Agent, or Firm*—Philip H. Burrus, IV

(57) ABSTRACT

This invention includes a circuit that approximates the thermal behavior of a fuse or other electronic device that is coupled in series with the circuit. In one preferred embodiment, the circuit protects a fuse coupled in series with a rechargeable battery from clearing during soft short conditions. Thus, when the instantaneous current is temporarily above the current rating of the fuse, yet the root mean squared current is below the current rating of the fuse, the circuit works to estimate the heating of the fuse element and limit the current to a root mean squared value that is less than the current rating of the fuse. One embodiment includes a programmable comparator that actuates a counter which, in turn, increments to estimate heating of the element when the current exceeds a predetermined threshold.

13 Claims, 5 Drawing Sheets

OVERCURRENT PROTECTION FOR THE SERIES FUSE

CROSS-REFERENCE TO RELATED APPLICATIONS

This application is a continuation in part of U.S. non-provisional application Ser. No. 09/545,135, filed Apr. 7, 2000 is now U.S. Pat. No. 6,300,750, which claims priority to U.S. Provisional Application Ser. No. 60/172,273, filed Dec. 17, 1999, the disclosures of which, including all attached documents and appendices, are incorporated by reference in their entirety for all purposes.

This application is also a continuation in part of U.S. non-provisional application Ser. No. entitled "Silicon Equivalent PTC Circuit", John Wendell Oglesbee, inventor, filed Oct. 17, 2000, which claims priority to U.S. Provisional Application Ser. No. 60/161,191, filed Oct. 22, 1999, the disclosures of which, including all attached documents and appendices, are incorporated by reference in their entirety for all purposes.

This application claims priority from U.S. Provisional Application Ser. No. 60/172,272, filed Dec. 17, 1999, the disclosures of which, including all attached documents and appendices, are incorporated by reference in their entirety for all purposes.

This application further claims priority from U.S. Provisional Application Ser. No. 60/202,150, filed May 5, 2000, the disclosures of which, including all attached documents and appendices, are incorporated by reference in their entirety for all purposes.

This application further claims priority from U.S. Provisional Application Ser. No. 60/203,795, filed May 9, 2000, the disclosures of which, including all attached documents and appendices, are incorporated by reference in their entirety for all purposes.

TECHNICAL FIELD

This invention relates generally to electronic circuits incorporating fuses coupled in series, and the preferred embodiment relates more specifically to protection circuits in battery charging circuits incorporating series fuses for circuit protection.

BACKGROUND

Electronic circuits often employ fuse elements for protection. When too much current runs through a fuse, i.e. a current in excess of the rating, the soft fuse material vaporizes, thereby opening the circuit. For example, a hair dryer may include a fuse that protects the hair dryer from over-current damage. If one accidentally drops a hair dryer in a sink, the water may create a path for excessive current to flow. This could cause the dryer to stop working. To avoid damage to the dryer, a fuse in series with the power cord will clear, thereby disconnecting the hair dryer from the wall outlet.

Rechargeable batteries often use fuses to protect the cell. When rechargeable batteries, like those made with lithium, if they are overcharged they can release gasses at high temperatures. When such a situation occurs, reliability of the battery may be compromised.

Consequently, rechargeable battery pack manufacturers often place fuses (in addition to battery protection circuits) in the battery packs. If a temporary problem occurs, the battery protection circuit, which includes transistor switches, will open the circuit to prevent an over-current situation. However, in the event that a catastrophic condition of battery protection circuit failure occurs, the fuse will clear thereby providing another layer of protection.

The problem with such fuses is that they are often non-replaceable. In other words, manufacturers often solder them to a circuit board that is inaccessible to the end user. Thus, when the fuse clears, the battery is protected, but it is also rendered useless as the battery cell is now disconnected from the terminals of the battery pack. Occasionally, a short current spike may cause the fuse to inadvertently blow. This is known as "nuisance tripping". If a nuisance trip occurs, the user must throw the battery away and buy another one, even though the cell and circuitry may be imperfect condition. With the cost of some batteries for cellular phones exceeding one-hundred dollars, there is thus a need for an improved protection circuit to prevent nuisance tripping in the series fuse.

DETAILED DESCRIPTION OF THE INVENTION

Figure 1:
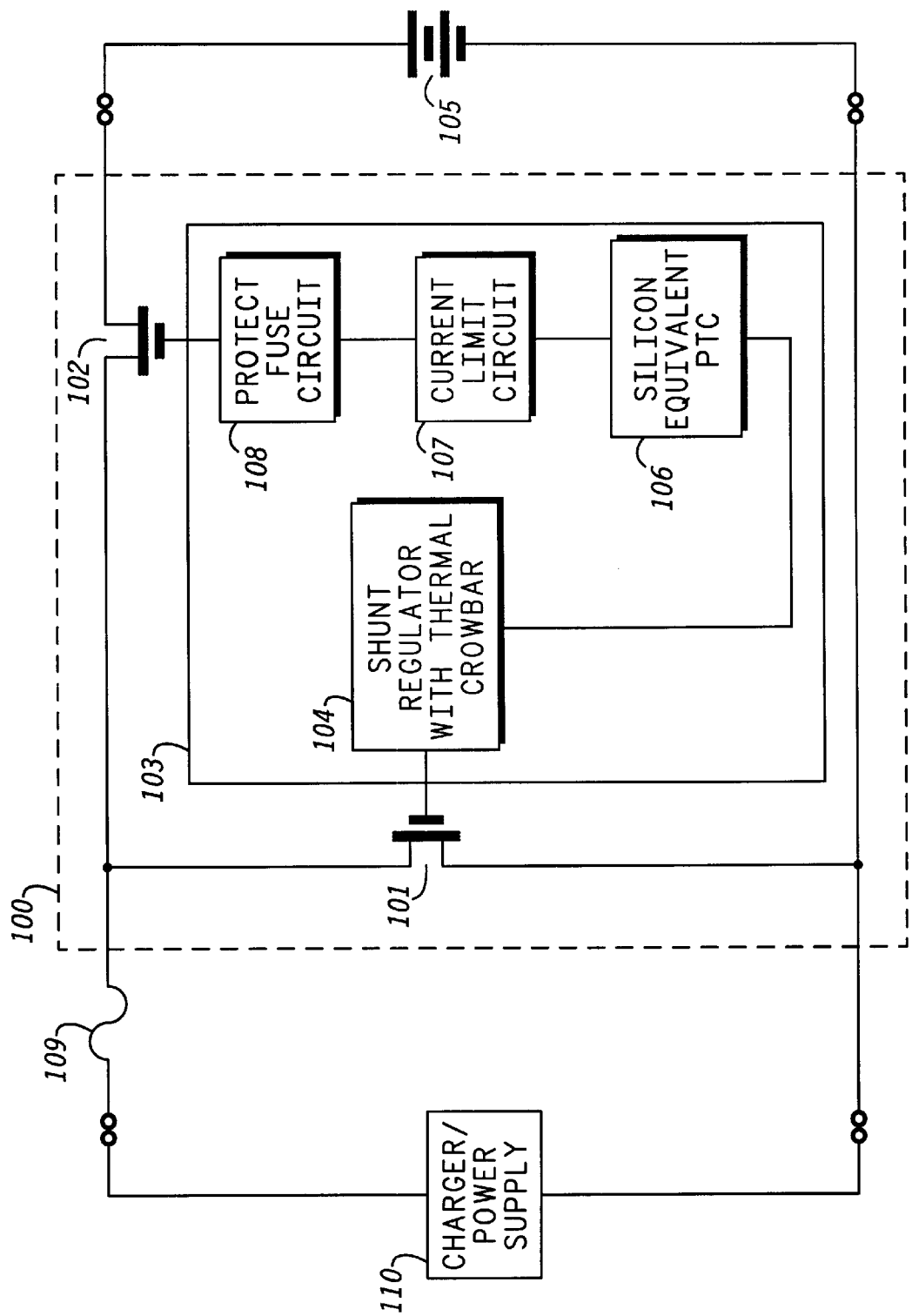
FIG. 1 is a schematic block diagram in accordance with the invention.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Referring now to FIG. 1, illustrated therein is a battery protection circuit as disclosed in U.S. Provisional Application Ser. No. 60/202,150, filed May 5, 2000 and U.S. Provisional Application Ser. No. 60/203,795, filed May 9, 2000. The protection circuit 100 includes a shunt transistor 101 and a series transistor 102, as well as a control circuit 103. The protection circuit 100 includes a shunt regulator with thermal crowbar as described in copending U.S. patent application Ser. No. 09/545,135, filed Apr. 7, 2000. The shunt regulator 104 essentially monitors the voltage across the cell 105. When this voltage increases above a predetermined threshold, the shunt regulator 104 causes the shunt transistor 101 to begin regulating voltage in a linear fashion by bypassing current around the cell 105. This current flowing through the shunt transistor 101 causes the shunt transistor 101 to heat due to $I^2R$ losses. When the temperature in the shunt transistor 101 reaches a predetermined threshold, the shunt regulator 104 causes the shunt transistor 101 to go into a full conduction mode, thereby minimizing the impedance across the shunt transistor 101. This action is called a "thermal crowbar" effect.

One skilled in the art is quick to notice that when the shunt transistor 101 moves into saturation, a low-impedance path is coupled across the cell 105. In other words, the conducting shunt transistor 101 becomes an effective "short" across the cell 105. To prevent the cell 105 from discharging itself, the shunt regulator 104 opens the series transistor 102 when the crowbar action commences. Thus, the cell 105 becomes electrically decoupled from the shunt transistor 101.

In addition from the opening action of the series transistor 102, the series transistor 102 performs other functions as well. In addition to the shunt regulator 104, the control circuit also comprises a silicon-equivalent PTC circuit 106 as described in copending U.S. non-provisional application entitled "Silicon Equivalent PTC Circuit", John Wendell Oglesbee, inventor, filed Oct. 17, 2000. The silicon-equivalent PTC circuit 106 is best explained by way of example. Under certain conditions, the voltage across the cell 105 may be below the predetermined threshold (and thus the shunt transistor 101 is not conducting), but the current flowing through the cell 105 may be in an abnormal range. Abnormally high currents are undesirable because they may potentially compromise the cell 105 or a host device. Consequently, when the current flowing in the series transistor 102 exceeds a predetermined current threshold, the silicon-equivalent PTC circuit 106 causes the series transistor to begin conducting in its ohmic, or linear, region. It does this by causing the impedance of the series transistor 102 to increase. The increase in impedance causes the device to heat due to $I^2R$ losses. When the temperature reaches a predetermined threshold, the silicon-equivalent PTC circuit 106 causes the series transistor 102 to open.

The control circuit 100 also contains a current limit circuit 107. As explained above, the silicon-equivalent PTC circuit 106 causes the series transistor 102 to open when the temperature reaches a predetermined threshold. This heating takes a time. If a short circuit were connected across the device, a very high current could pass through the cell 105. If the current were sufficiently high, damage to the cell 105 could occur before the silicon-equivalent PTC circuit 106 has had time to heat enough to trip. In such an event, the current limit circuit 107 limits impulse currents to a predetermined level, thereby protecting the cell 105.

While the above mentioned circuits all provide protection for the cell, there is another problem that can slip "under the radar" if only the elements above are included. This condition is known as a "soft short". One object of this invention is to provide a protection mechanism against soft shorts.

A soft short is a condition whereby the current flowing through the cell 105 is sufficiently high to potentially cause nuisance tripping of the fuse, but is not high enough for the current limit circuit 107 to trip, nor is it high enough to cause the silicon-equivalent PTC circuit 106 to open the series transistor in a short enough time to ensure that the fuse 109 does not clear. Thus, a fuse protection circuit 108 is included in the control circuit 103.

Figure 2:
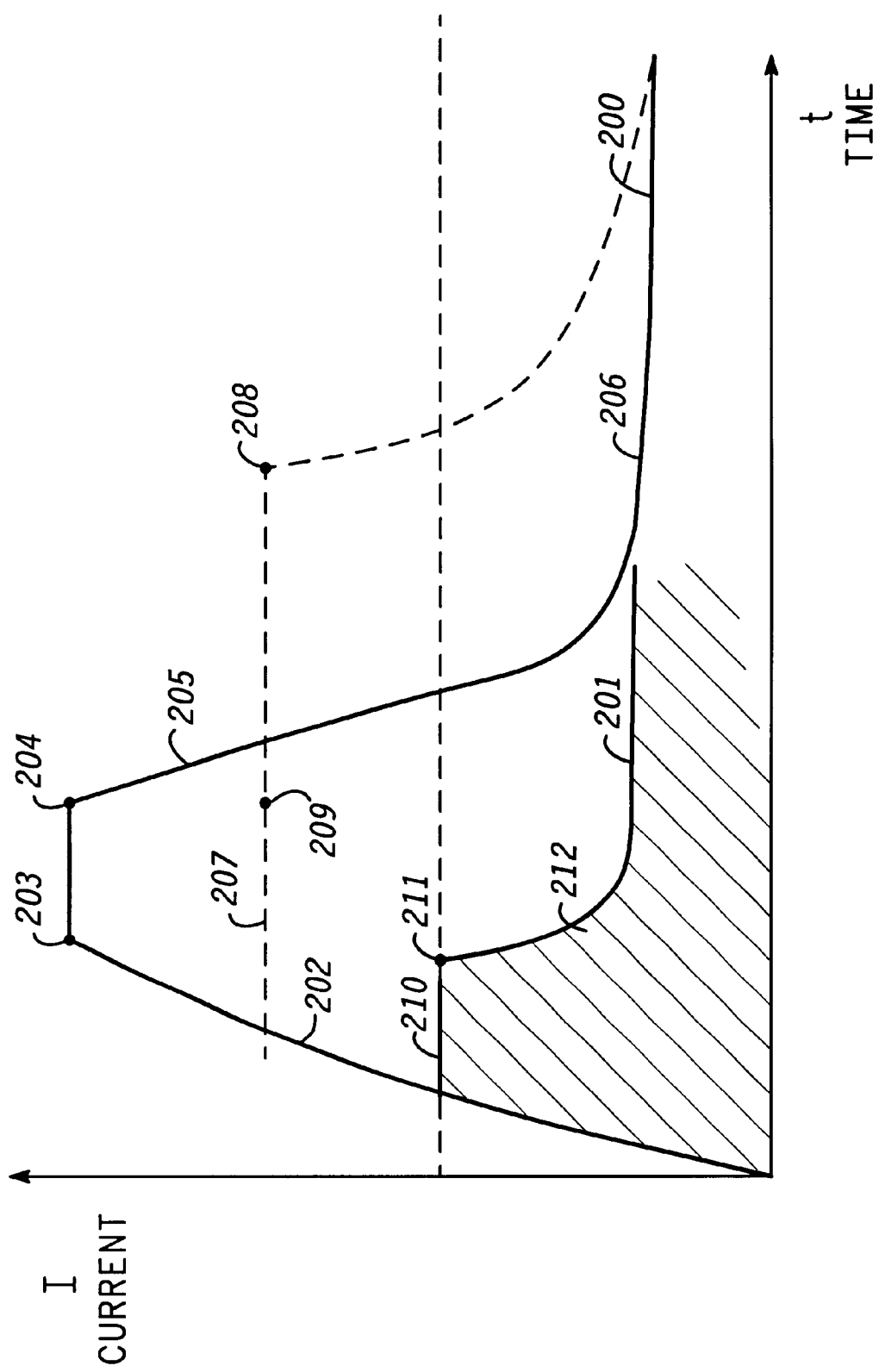
FIG. 2 is a comparison graph of current versus time in accordance with the invention.

Referring now to FIG. 2, (circuit numbers from FIG. 1 will be carried throughout the discussion of FIG. 2 for reference convenience) a graph is shown explaining the necessity for the fuse protection circuit 108. Plot 200 illustrates the action that occurs when a silicon-equivalent PTC 106 circuit and current limit circuit 107 are included in the control circuit 100. Assuming that the voltage across the cell 105 remains below the predetermined threshold, a soft short connected to the circuit may cause a significant current pulse as illustrated by line 202. Normally, this line 202 would continue to a self-determined maximum (dependent upon the impedance of the battery circuit and the impedance of the short). Here, however, it is arrested and limited by the current limit circuit at point 203. The current stays limited as per point 203 until the series transistor 102 heats to a predetermined threshold. When this occurs, the silicon-equivalent PTC circuit 106 actuates at point 204. The actuation causes the impedance of the series transistor 102 to rise (and the corresponding current to fall, line 205) until the power generated in the series transistor 102 reaches equilibrium with the power dissipation at line 206.

It is well to briefly discuss fuses here. Fuses clear when a sufficient current flows through the fuse for a sufficient amount of time. For example, a 2 A fuse will pass 2 A indefinitely. A 2.1 A current, will cause a 2 A fuse to clear after a certain amount of time t1. A 10 A current will cause a 2 A fuse to clear after a time t2, where t2 is less than t1. Thus, the product of current and time (which is proportional to the $I^2R$ heating of the fuse element) will cause a fuse to clear.

Referring again to FIG. 2, if a soft short is placed across the terminals of a battery, the battery may discharge at a current that is sufficient to cause the fuse to clear before the silicon-equivalent PTC circuit 107 opens. By way of example, assume that the current limit circuit 107 is set to limit current at 10A. Additionally, assume that the fuse is rated at 2 A. If the user puts the battery in his pocket and a key chain, with a specific impedance, shorts the terminals of the battery pack, the impedance of the key chain may cause a current such as 5 A to flow through the series transistor 102. Were this scenario to present itself, line 209 would represent the current. As the series transistor 102 heated, the silicon-equivalent PTC circuit 106 would eventually trip at point 208. This time, however, may not be correlated to the thermal characteristics of the series fuse 109. Consequently, the fuse may have only been able to conduct current until point 209. Under these conditions, the battery pack would be rendered useless by a nuisance trip, even though the battery cell 105 is still in working condition. Consequently, one object of this invention is to produce a circuit that emulates the thermal characteristics of a fuse by limiting current at line 210, for a time as point 211, such that the area under the curve 212, which represents current times time, is insufficient to clear the fuse. The key chain problem of nuisance tripping due to soft shorts would thereby be eliminated.

Figure 3:
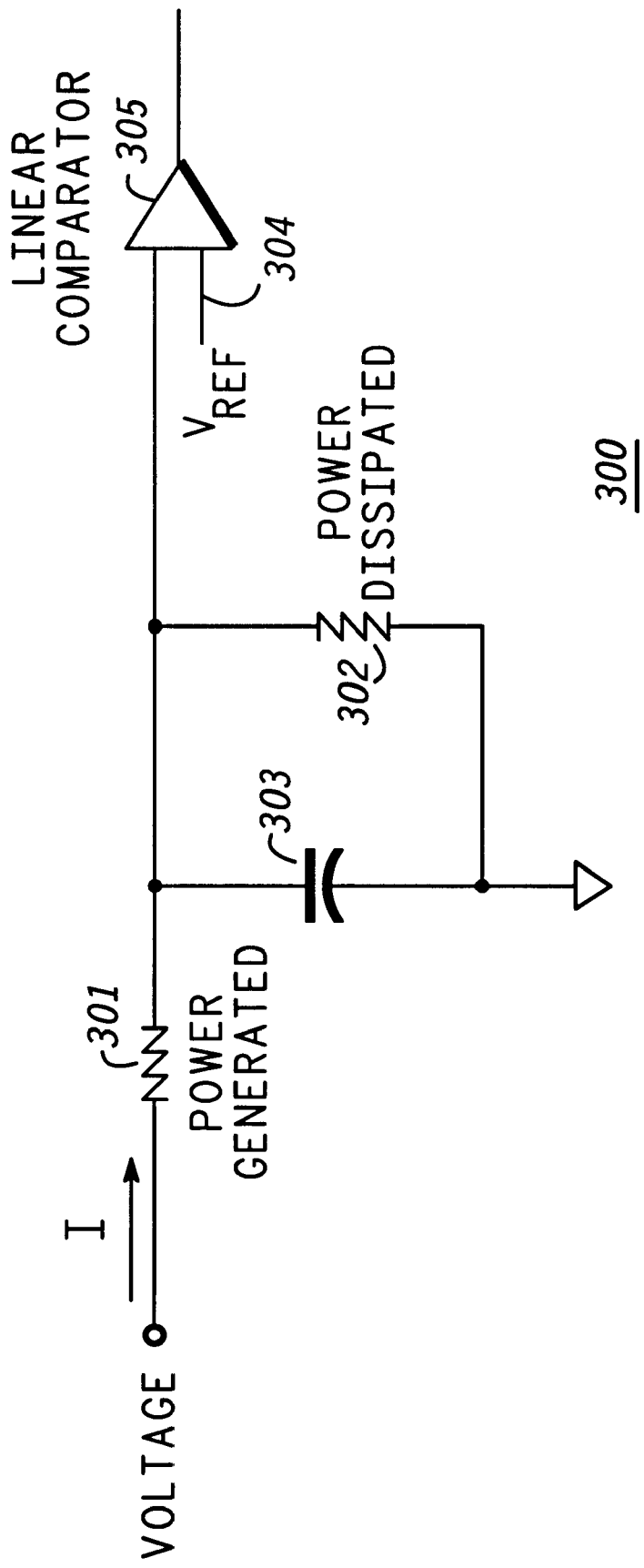
FIG. 3 is an analogous thermal estimator circuit in accordance with the invention.

Referring now to FIG. 3, illustrated therein is an electrical circuit 300 that approximates the thermal response of a fuse. A first resistor 301 is analogous to the parasitic impedance that causes power generation in a fuse. This first resistor 301 limits the current of an input voltage in proportion to the heating of the fuse. Thus, the first resistor 301, in combination with the capacitor 303, define a circuit that allows the capacitor 303 to charge at a rate which is proportional to the heating of a fuse, defined by the impedance and thermal mass. A second resistor 302, correspondingly discharges the capacitor 303 at a rate that is proportional to fuse's loss of heat to the atmosphere. The discharge rate is often slower than the charging rate. In any event, if the output of this circuit is coupled to a comparator 305 having a reference voltage 304, the reference voltage 304 may be set to a level so as to correspond to a predetermined time when the fuse would normally clear. Thus, when the voltage across the capacitor 303 exceeds the reference voltage 304, the fuse protection circuit can open the series transistor, thereby preventing the fuse from a nuisance trip.

While the circuit shown in FIG. 3 is an effective fuse heating approximation circuit, it is difficult to realize in a silicon integrated circuit (IC). This is because resistive elements are difficult to trim on silicon. In addition, the capacitor may be of such great size that it occupies a tremendous amount of the silicon real estate at a prohibitive cost.

Figure 4:
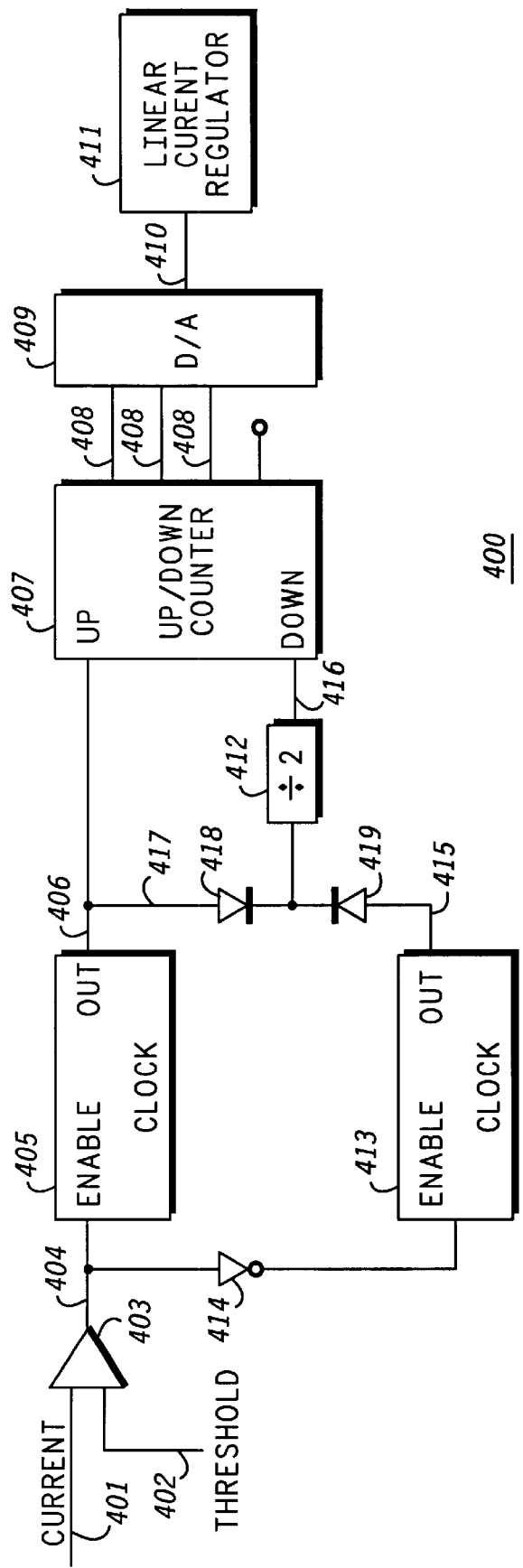
FIG. 4 is one preferred embodiment of a thermal estimator circuit in accordance with the invention.

Referring now to FIG. 4, illustrated therein is a preferred embodiment of the invention. The circuit 400 corresponds to the protect fuse circuit 108 of FIG. 1. The circuit 400 is a thermal fuse estimator capable of being inexpensively realized on silicon. The circuit 400 includes a current input that is proportional to the level of current flowing in a pass element. This level can be measured using a variety of techniques known in the art, including sensing the voltage across a series resistor. A threshold voltage 402 is also provided.

A comparator 403 compares the threshold voltage 402 to the current level 401. When the current level 401 exceeds the threshold voltage 402, indicative of a potential nuisance trip current flow, the output of a comparator 404 goes active high and actuates the enable pin of a first clock 405. The first clock 405 is coupled directly to an up/down counter 407. When the counter 407 is counting up, this is analogous to the series fuse in the circuit heating.

When the current level 401 is less than the threshold voltage 402, the comparator output 404 is active low. This turns the first clock 405 off, but causes an active high signal to enable a second counter 413 via a series inverter 414. When the second clock 413 is active, the clock output 415 is coupled into a frequency divider 412 that divides the clock output 415 by a predetermined factor, which is in this exemplary embodiment 2. This divided output 416 causes the counter to count down, which is analogous to the series fuse element cooling due to the loss of heat to the environment. It will be clear to those skilled in the art that the frequency divider 412 is optional, in that the clocks could be designed to oscillate at different frequencies. The frequency counter 412 does have benefits in that it can be programmed to any arbitrary factor, which need not be 2 as in this exemplary embodiment.

The division of frequency occurs because a series fuse loses heat to the environment at a rate slower that the current flowing through the fuse heats it. Thus, the counting down, or cooling, is at a slower rate (due to the frequency division) than is the counting up, or heating. It is well to note that the series fuse does lose some heat to the environment while current is flowing through it. For this reason, an optional cooling input 417 has been logically "OR'ed" with the second clock 413 through the "OR"ing diodes 418 and 419. Thus, while the series fuse is cooling both when the current level 401 exceeds and is less than the threshold voltage 402, the temperature can never descend below ambient, which is represented by a count of zero in the counter 407 which may be calibrated to a predetermined temperature.

There are advantages in having the second clock 413 stop counting when the counter 407 reaches zero. The primary incentive to have the second clock stop is to prevent the internal protection circuits from unnecessarily discharging the battery. Thus, a latch, like an S/R flip flop could be added such that when the counter 407 reaches a zero count, the second clock 413 would become disabled. Neither the first clock 405 nor the second clock 407 would be enabled, in this case, until the current exceeded the predetermined threshold once again.

The output of the counter, which in this exemplary embodiment is represented by the three most significant bits 408, is then coupled to a digital to analog (D/A) converter 409 that converts the digital inputs 408 to an analog voltage 410. This analog voltage 410 is then coupled to a linear regulator 411 that limits the current in the series fuse such that the series fuse is prevented from nuisance tripping.

To recap, when the current exceeds a predetermined threshold the comparator output 404 goes high, causing the first clock 405 to be enabled and the second clock 413 to be disabled. The clock output 406 is coupled to the up count (representing heating of the series fuse) of an up/down counter 407, while a divided clock 416 is coupled to the down count (representing slower cooling of the series fuse) of the counter 407. The most significant bits 408 are coupled to a D/A converter 411. As the count increases, the output of the D/A 410 increases, causing current flowing in the series fuse to be limited by way of a linear current regulator 411. Thus, as current exceeds the threshold across time, the circuit 400 limits current to prevent the series fuse from clearing.

Correspondingly, when the current level 401 is below the threshold voltage 402, the second clock 413 is enabled which represents cooling of the series fuse. This clock 413 represents the continued cooling when current in the series fuse has dropped below the threshold. The cooling cannot drop below ambient, which is represented by a zero count of the counter.

It will be clear to those skilled in the art that the invention is not limited to a single comparator or a single clock rate. The invention could comprise any number of comparators and clocks of varying frequencies to approximate the thermal response of any component. In it's most general form, the invention would comprise at least one comparator coupled to digital select logic that selects at least one corresponding clock. The output would be coupled to the up or down input of the counter, depending upon whether the device was heating or cooling. The clocks could all be disabled when the counter reached a zero count to prevent current drain on the battery.

It will further be clear that the invention need not include more than one clock. The clock select logic could be made so as to switch the clock input from increment to decrement depending upon whether the current was above or below the predetermined threshold. Additionally, as clocks are now programmable, when the switch from increment to decrement, or vice versa, were made, the clock could be programmed to any desired frequency. This could also be accomplished with a programmable frequency divider.

Figure 5:
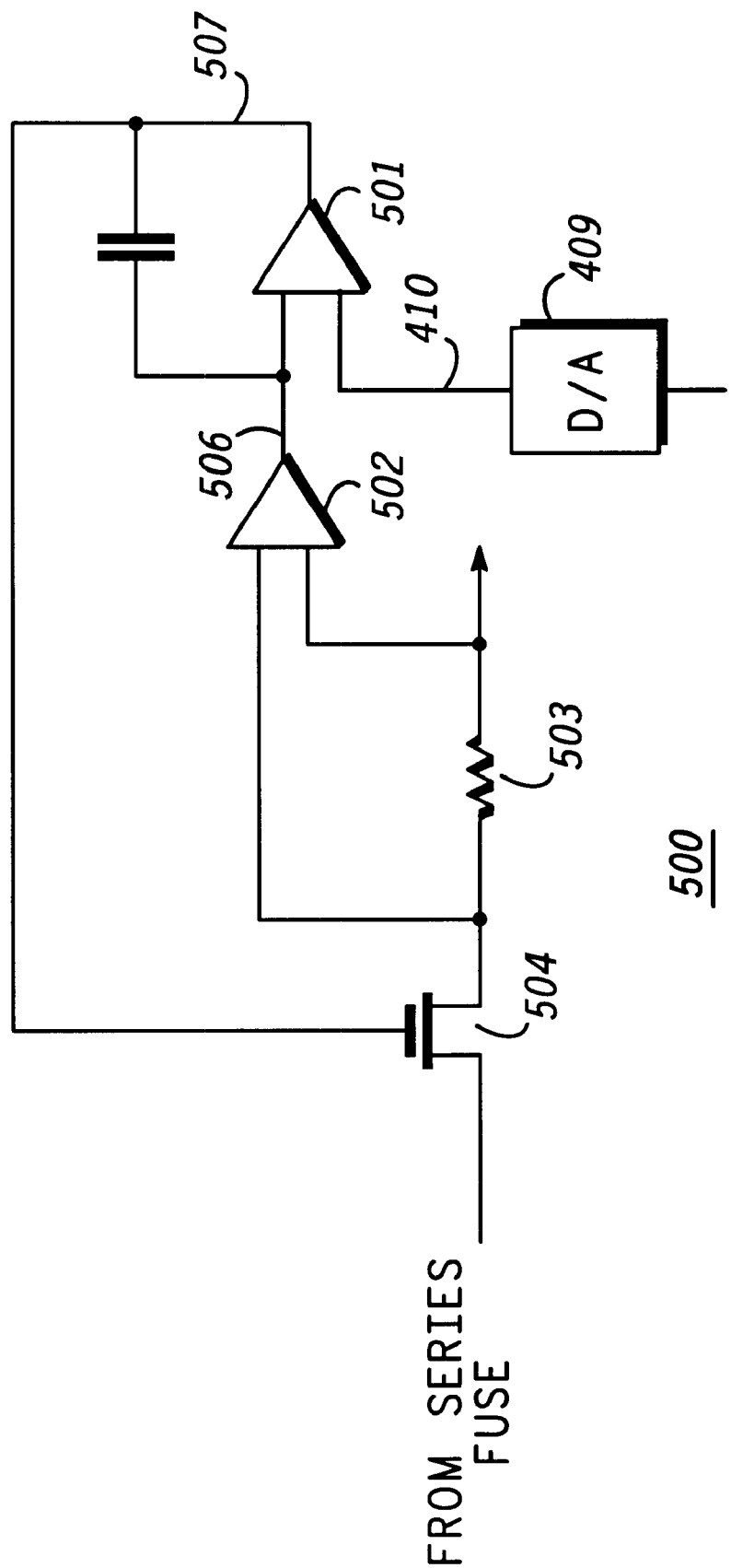
FIG. 5 is a linear current regulator in accordance with the invention.

Referring now to FIG. 5, illustrated therein is a preferred embodiment of a linear current regulator as represented by block 411 in FIG. 4. The analog voltage output 410 from the D/A 409 is fed into a linear amplifier 501. Simultaneously, a voltage corresponding to the current flowing through the series fuse 506 is also coupled into the linear amplifier. A linear current regulator, comprising a current sense resistor 503 and a second amplifier 502 as is known in the art, generates the voltage corresponding to the current flowing through the series fuse 506.

When the voltage from the D/A 410 is below the voltage corresponding to the current flowing through the series fuse 506, the linear amplifier operates the pass transistor 504 in its fully conducting mode. Note that the pass transistor 504 may be, but needn't necessarily be, the same transistor as series transistor 102 in FIG. 1. When the voltage from the D/A 505 exceeds the current flowing through the series fuse 506, indicative of the fuse element heating, the output of the linear amplifier 507 increases, causing the pass transistor's impedance to increase, thereby reducing the current. The circuit 500 employs negative feedback to continue the cessation of current until an equilibrium state is reached.

Thus, in summary, a problem in traditional battery circuits occurs if a soft short overload current should occur just under the protection circuit current limit threshold. For this situation, the protection circuit may sustain a current just below its maximum limit value, for example 4.5 amps. If 4.499 amps were to flow in the protection circuit, the heating of the protection circuit is 0.708 watts based on a minimum on resistance of 35 milliohms for the series pass transistor. Under unfavorable conditions, this 0.708 watts may not trip the protection circuit thermally, or it may take so long to trip thermally that the fuse opens during the time the protection circuit is reaching its trip temperature.

To protect the fuse, the protection circuit must have a protection delay characteristic that approximates that of the time delay fuse. The protection circuit must sustain "short" current pulses to support normal load current pulses. But if the RMS discharge load current is sustained for a significant time above a predetermined limit, the protection circuit must begin to limit the current to protect the fuse. In the ideal world, the protection circuit would contain a thermal and electrical model of the fuse trip characteristics, and would shutoff just before any damage to the fuse occurred. Such circuits can be difficult and expensive to realize on silicon, however.

This invention thus contemplates a protection circuit that includes a time delay characteristic that corresponds to the thermal characteristics of the fuse. For short pulses, the current limit value may be, for example 4.5 A maximum. For sustained overloads however, the invention reduces the sustainable current across time as the series fuse heats.

This invention includes a comparator threshold for detecting an instantaneous discharge current in excess of a predetermined threshold. If the instantaneous current is above the predetermined threshold, clock a counter up, indicating an overload condition. If the instantaneous current is below the predetermined threshold, clock a counter down, indicating no overload. In simple terms, counting up indicates the fuse element is heating up past normal design temperature limits, counting down indicates that the fuse element is cooling down below normal design temperature limits.

If the counter continues to accumulate counts up past a particular count, begin decreasing the value at which current limiting regulation action of the protection circuit occurs. For each additional count (in the up direction) continue decreasing the value of the current limiting regulating threshold. This is a poor man's approximation to an integrator and fuse thermal/electrical model. The counter approximates the fuse element temperature. If the temperature approximation in the counter becomes critical, the current limit regulator circuit begins progressively decreasing current through the fuse to protect the fuse. The counter must be protected from over-flow and under-flow.

By way of a mathematical example: Although not perfect, the math is such that it guarantees that the fuse RMS current stays within design bounds. For this example assume the up-count rate is twice the down-count rate, and that the clock and counter scaling is such that the counter reaches it's critical value after one second of continuous counting in the up direction. Also assume that the peak current limit is 4.5 A, the fuse is rated for 3 A, and the predetermined threshold is 2 A. Since the up rate is twice the down rate, and since peak current is always less than 4.5 A, and since the current is always less than 2.0 A when counting down, then averaged over one period the mean squared value of the current cannot exceed:

Root Mean Squared=$SQRT([4.5A*4.5A*1Sec]+[2.0A*2.0A*2Sec])/3$ second)=3.1 A

The integrating nature of the counter algorithm is such that an RMS value of 3.0 amps is never exceeded over any period of operation. Therefore, the fuse is always protected.

While the preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims.

What is claimed is:

1. An electronic circuit that approximates the thermal characteristics of an electronic device, wherein the electronic device is selected from the group consisting of fuses and transistors, wherein the circuit is coupled in series with a fuse.

2. The circuit of claim 1, wherein the circuit reduces current delivered to the fuse so as to prevent the fuse from clearing so long as the root mean squared value of current is below the fuses current rating.

3. The circuit of claim 2, wherein the circuit is manufactured on a semiconductor die.

4. The circuit of claim 3, wherein the circuit is coupled to a rechargeable battery cell.

5. The circuit of claim 4, wherein the circuit comprises:
   a. a comparator to sense when the current flowing through the fuse exceeds a predetermined threshold;
   b. at least one clock coupled to the comparator, the at least one clock being actuated by the current exceeding the predetermined threshold; and
   c. a counter having at least one output bit, the counter incrementing when the current exceeds the predetermined threshold and decrementing when the current is below the predetermined threshold.

6. The circuit of claim 5, wherein the circuit further comprises:
   a. an digital to analog converter having an output and an input, such that the input coupled to at least one output bit of the counter; and
   b. a linear current regulator coupled to the digital to analog converter such that the linear current regulator limits current as the output of the digital to analog converter increases.

7. A circuit approximating the thermal characteristics of an electrical device, comprising:
   a. at least one means for sensing current, the at least one means actuating a first signal when the current exceeds a predetermined threshold; and
   b. at least one clock coupled to the means for sensing current, such that the at least one clock is enabled when the first signal is actuated.

8. The circuit of claim 7, further comprising:
   a. clock select logic, wherein when one of the at least one means for sensing current is actuated, a corresponding clock is selected; and
   b. a counter with a increment input coupled to clock select logic and a decrement input coupled to the clock select logic.

9. The circuit of claim 8, further comprising:
   a. a digital to analog converter coupled to the counter; and
   b. a linear current regulator coupled to the digital to analog converter,
   wherein the linear current regulator limits current proportionally to an output of the digital to analog converter.

10. The circuit of claim 9, wherein the circuit is coupled in series with a fuse.

11. The circuit of claim 10, wherein the circuit limits the current so as to prevent the fuse from clearing so long as the root mean squared current flowing in the fuse is less than the current rating of the fuse.

12. A method of protecting a fuse coupled in series with an electronic circuit, the method comprising the steps of:
   a. providing a means for comparing the current in the fuse with a predetermined threshold;
   b. providing a means for determining the time at which the current is above, and the time at which the current is below the predetermined threshold;
   c. sensing the current flowing in the fuse; and
   d. reducing the current to a root mean squared level that is less than the current rating of the fuse.

13. The method of claim 12, wherein the fuse is coupled in series with a rechargeable battery cell.

* * * * *